United States Patent
Takeuchi et al.

(10) Patent No.: US 6,906,944 B2
(45) Date of Patent: Jun. 14, 2005

(54) FERROELECTRIC MEMORY

(75) Inventors: Yoshiaki Takeuchi, Yokohama (JP); Yukihito Oowaki, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 114 days.

(21) Appl. No.: 10/676,004

(22) Filed: Oct. 2, 2003

(65) Prior Publication Data

US 2004/0062115 A1 Apr. 1, 2004

Related U.S. Application Data

(62) Division of application No. 09/799,694, filed on Mar. 7, 2001, now Pat. No. 6,643,162.

(30) Foreign Application Priority Data

Mar. 10, 2000 (JP) .......................................... 2000-66689

(51) Int. Cl.[7] .............................................. G11C 11/22
(52) U.S. Cl. ...................... 365/145; 365/226; 365/227; 365/65
(58) Field of Search ................................ 365/145, 226, 365/227, 65

(56) References Cited

U.S. PATENT DOCUMENTS

| | | |
|---|---|---|
| 5,363,333 A | 11/1994 | Tsujimoto |
| 5,532,953 A | 7/1996 | Ruesch et al. |
| 5,703,804 A | 12/1997 | Takata et al. |
| 5,781,494 A | 7/1998 | Bae et al. |
| 5,881,012 A * | 3/1999 | Kawasaki et al. .......... 365/226 |
| 6,151,242 A | 11/2000 | Takashima |
| 6,333,517 B1 | 12/2001 | Tamaki |
| 6,373,744 B1 * | 4/2002 | Mano ........................ 365/145 |

FOREIGN PATENT DOCUMENTS

JP    2000-123578    4/2000

* cited by examiner

*Primary Examiner*—Connie C. Yoha
(74) *Attorney, Agent, or Firm*—Banner & Witcoff, LTD.

(57) ABSTRACT

A ferroelectric memory has a memory cell array of memory cells having ferroelectric capacitors, which is divided into a plurality of blocks, a boost power circuit provided in each block of the memory cell array to generate a boost voltage required for operation of the memory, a boost power switch provided between a power line connected to an external power terminal and a power supply terminal of each boost power circuit, and remaining ON during normal operation of the memory, a voltage detector circuit for detecting a drop of voltage level of the power line, and a switch control circuit for turning off the boost power switches in the blocks of the memory cell array excluding the boost power switch in a currently selected block in response to the voltage detector circuit.

7 Claims, 7 Drawing Sheets

FERROELECTRIC MEMORY

CROSS REFERENCE TO RELATED APPLICATIONS

This application is a divisional of prior U.S. application Ser. No. 09/799,694, filed Mar. 7, 2001 now U.S. Pat. No. 6,643,162, which is related to subject matter disclosed in Japanese Patent Application No. 2000-66689 filed on Mar. 10, 2000 in Japan to which the subject application claims priority under Paris Convention and which is incorporated herein by reference.

BACKGROUND OF THE INVENTION

This invention relates to a ferroelectric memory (hereinafter sometimes referred to as FeRAM), and more particularly to performance assurance of a ferroelectric memory used in a destructive reading mode.

As a ferroelectric memory, there is known one having a combination of a ferroelectric capacitor and a transistor to form a ferroelectric memory cell that can be electrically rewritable. This type of ferroelectric memory is capable of nonvolatile storage of data by using a hysteresis characteristic of the ferroelectric capacitor. That is, it is similar to EEPROM in capability of holding data even after the power supply is interrupted, and its application to various kinds of IC cards and portable terminals, for example.

With such a ferromagnetic memory, however, unlike EEPROM, data reading is destructive reading. That is, when data is read out, one of "0" and "1" is accompanied by spontaneous polarization reversal, and rewriting is indispensable. This means that stored data is destructed upon interruption of the power supply or a decrease of the voltage below an operation assurance voltage during data reading or other operation.

The conventional ferroelectric memory is not assisted by any operation assurance against accidental interruption of the power supply, for example, during operation.

SUMMARY OF THE INVENTION

It is therefore an object of the invention to provide a ferroelectric memory with operation assurance against a drop of the power supply during operation.

According to one aspect of the present invention, there is provided a ferroelectric memory having:

a memory cell array of memory cells having ferroelectric capacitors, which is divided into a plurality of blocks:

a boost power circuit provided in each said block of said memory cell array to generate a boost voltage required for operation of the memory;

a boost power switch provided between a power line connected to an external power terminal and a power supply terminal of each said boost power circuit, and remaining ON during normal operation of the memory;

a voltage detector circuit for detecting a drop of voltage level of said power line; and a switch control circuit for turning off said boost power switches in said blocks of said memory cell array excluding the boost power switch in a currently selected block in response to said voltage detector circuit.

According to another aspect of the present invention, there is provided a ferroelectric memory having:

a memory cell array of memory cells having ferroelectric capacitors, which is divided into a plurality of blocks:

a first power switch of normally closed type connected to an external power terminal;

a power line, one end thereof being connected to said first power switch and the other end thereof being grounded via a first power capacitor;

a boost power circuit connected to said power line and provided in each said block of said memory cell array to generate a boost voltage required for operation of the memory;

a second power switch of normally open type connected in parallel to said boost power circuit and provided in each said block of said memory cell array;

a voltage detector circuit for detecting a drop of voltage level of said power line; and a switch control circuit for turning on said second power switches in said blocks of said memory cell array excluding the second power switch in a currently selected block in response to said voltage detector circuit.

According to the invention, when the voltage value decreases below an operation assurance voltage in a boost power circuit provided in each block of a memory array and normally supplied with a power supply, the source voltage of a selected block is enhanced or compensated by turning off the power switches of boost power circuits excluding the boost power circuit of a currently selected block and thereby supplying an external source voltage only to the boost power circuit of the selected block (supplying the voltage held in the power line capacitor only to the boost power circuit of the selected block even when the external power supply is interrupted). Thereby, destruction of stored data in the selected block can be prevented.

BRIEF DESCRIPTION OF THE DRAWINGS

In the attached drawings.

DESCRIPTION OF THE PREFERRED EMBODIMENTS

Explained below are embodiments of the invention with reference to the drawings.

Figure 1:
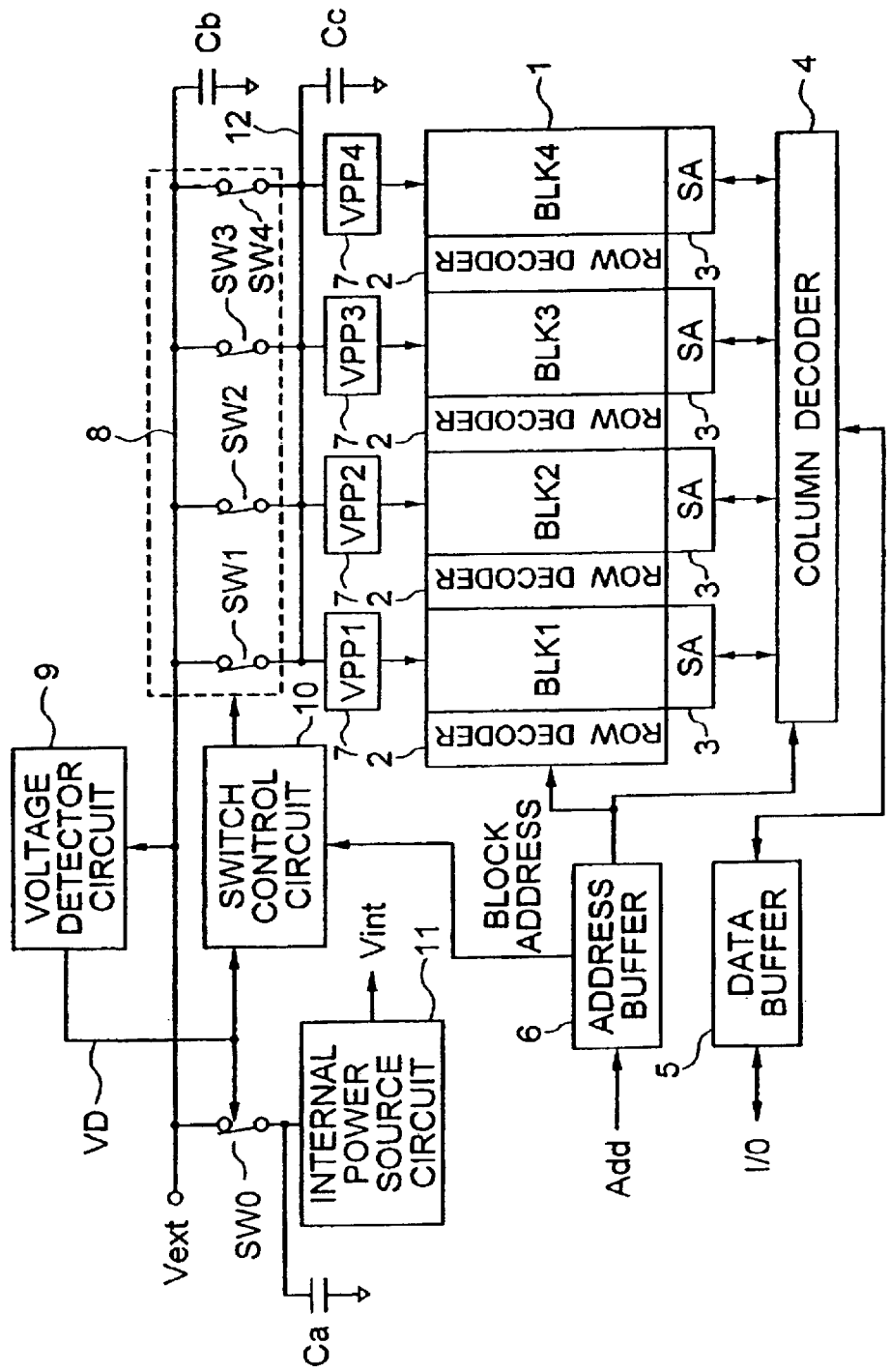
FIG. 1 is a diagram that shows configuration of FeRAM according to an embodiment of the invention.

FIG. 1 is a block diagram that shows configuration of ferroelectric memory (FeRAM) according to an embodiment of the invention. A memory cell array 1 is divided into a plurality of (four, in the illustrated example) blocks BLKi (i=1 through 4). Row decoders 2 function to select a word line from the memory cell array 1, and sense amplifier circuits 3 function to detect and amplify a bit line address supplied from outside and introduced into an address buffer 6, then supplied to a row decoder 2 and the column decoder 4 such that a row address and a column address are decoded, respectively.

A boost power circuit 7 for applying a raised high voltage to a selected word line of the memory cell array 1 is provided in each block BLKi. Although a power terminal of each boost power circuit 7 is supplied with a voltage of an external power terminal, Vext, via a power line 8, boost power switches SWi are inserted between the power line 8 and power terminals of respective boost power circuits 7. Additionally, an internal power circuit 11 for generating an internal power voltage Vint to be supplied to individual circuits other than the boost power circuits 7 is provided in the power line 8, an internal power switch SW0 is inserted also between the internal power circuit 11 and the power line 8.

The boost power switches SWi and the internal power switch SW0 are controlled by a switch control circuit 10 to be always ON when the chip is active. A first power capacitor Ca is provided between the switch SW0 side of the internal power source circuit 11 and the ground. A second power capacitor Cb is coupled between the power line 8 and the ground, and a third power capacitor Cc is coupled between a power supply line 12 commonly connecting the boost power circuits 7 and the ground.

On the power line 8 connecting to the external power terminal, a voltage detector circuit 9 is provided for detecting that the external power voltage Vext drops below a predetermined level. When the voltage detector circuit 9 detects a voltage drop of the external power voltage Vext by some reason during memory operation, the detection signal VD is sent to a switch control circuit 10. In receipt of the detection signal VD, the switch control circuit 10 performs controls to turn the internal power switch SW0 OFF and turn all of the boost power switches SWi OFF excluding that of the boost power circuit 7 of the currently selected block. At that time, the switch control circuit 10 receives the address of the currently selected block BLKi sent from the address buffer 6, and in response to this, it selectively controls the boost power switches SWi OFF.

Figure 2:
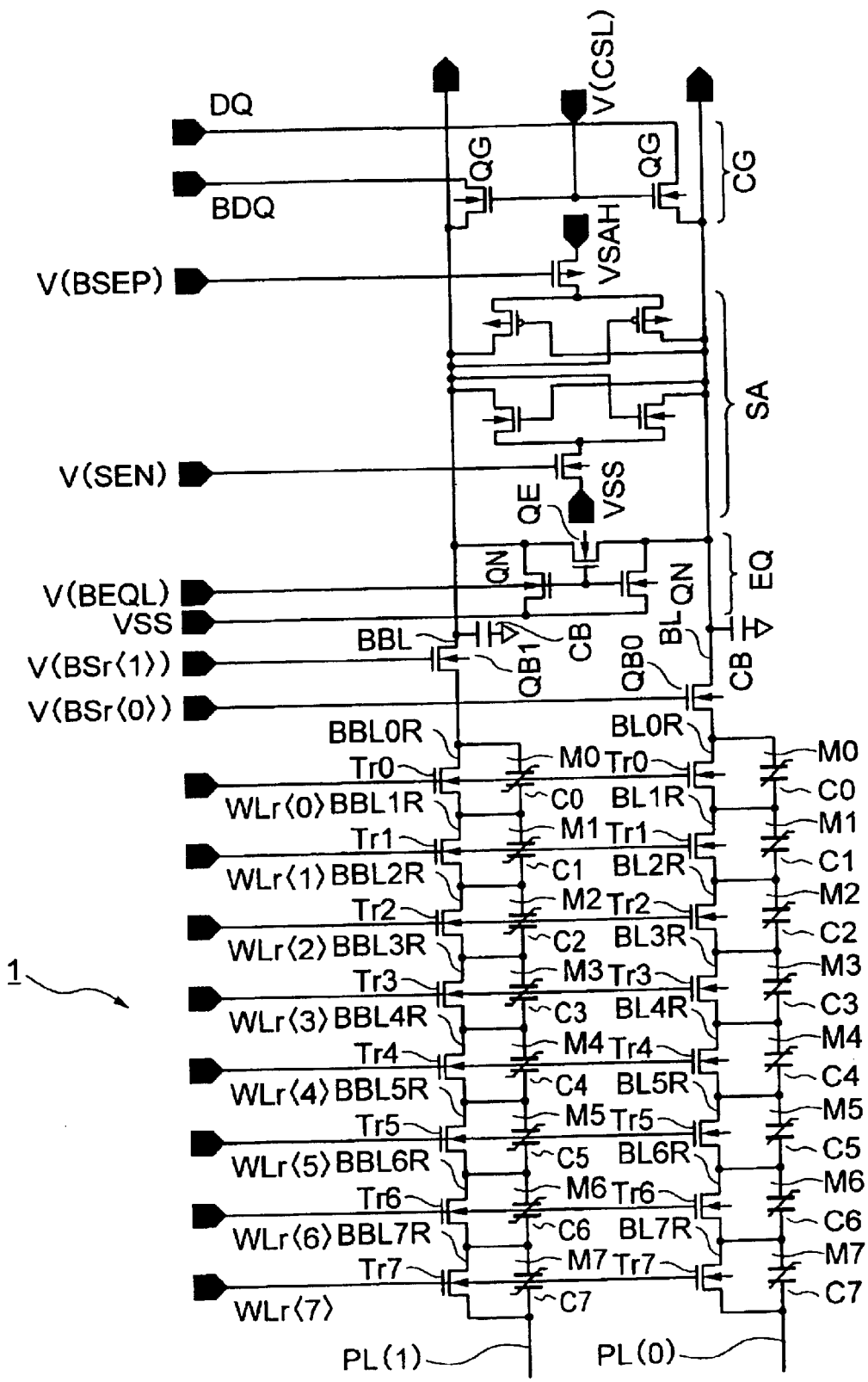
FIG. 2 is a diagram that shows configuration of a memory array in FeRAM according to the same embodiment of the invention.

FIG. 2 shows concrete configuration of the memory cell array 1 by way of memory cell units of paired two bit lines. In the embodiment shown here, each memory cell unit has a plurality of memory cells Mj (eight memory cells, namely, j=0 through 7, in the illustrated example) connected in series. That is, in each memory cell unit, transistors Trj are connected in series, and ferroelectric capacitors Cj are connected in parallel between the source and the drain of each transistor Trj. A plurality of such units are connected in series to form ferroelectric memory (hereinafter called series connected TC unit type ferroelectric RAM).

One of the memory cell units is connected at one end to a plate line PL(0), and the other to a plate line PL(1). The other ends of these memory cell units are connected to bit lines BL and BBL via block selection transistors QB0 and QB1, respectively. Gates of the transistors Trj of memory cells Mj are controlled by word lines WLr<j>.

Provided for the bit lines BL and BBL is an equalizer circuit EQ. The bit lines BL and BBL are connected to data lines DQ and BDQ via a sense amplifier SA and a column gate CG (contained in the column decoder 4 shown in FIG. 1).

Figure 3:
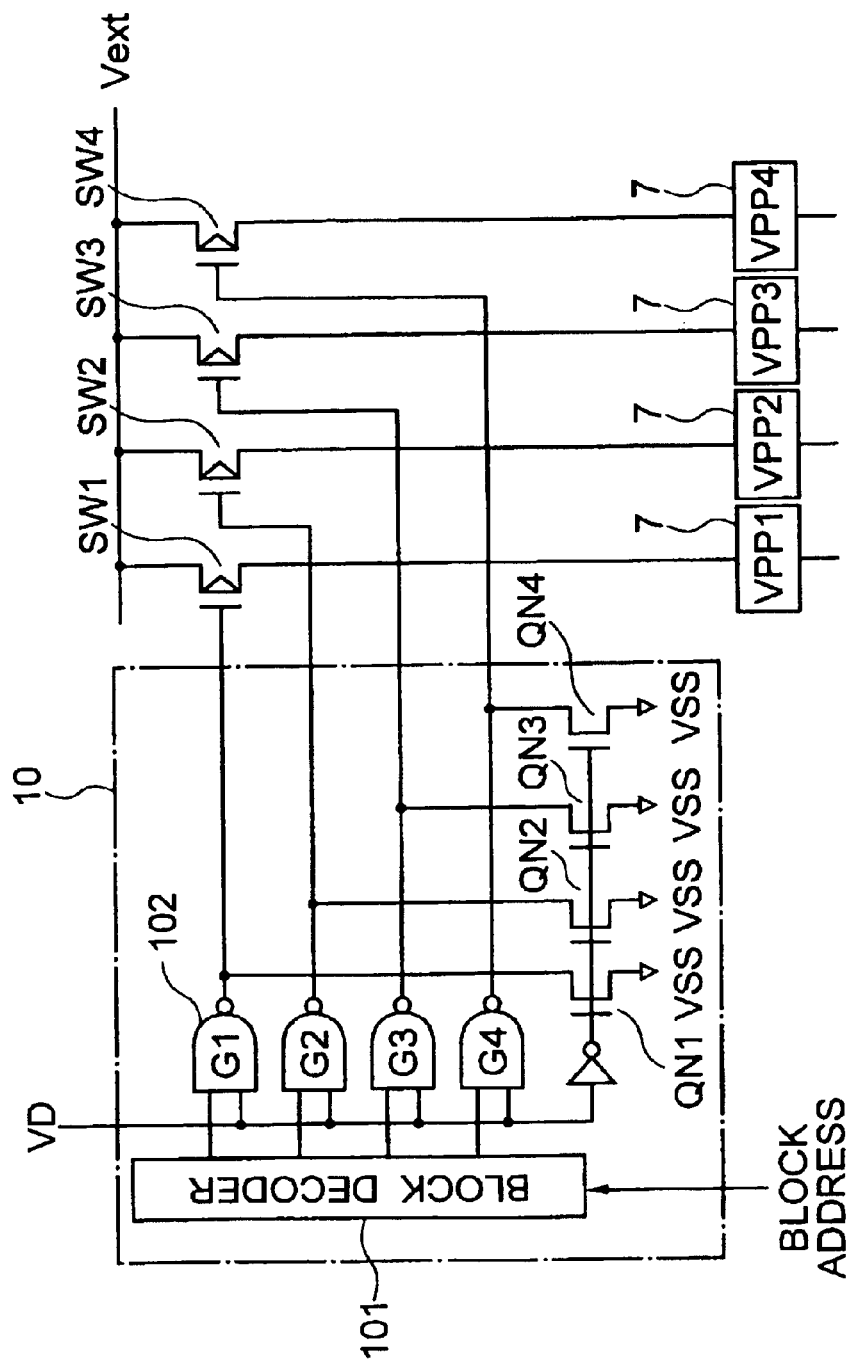
FIG. 3 is a diagram that shows configuration of a switch control circuit of FeRAM according to the same embodiment of the invention.

FIG. 3 shows an example of concrete configuration of the switch control circuit 10. The switch control circuit 10 includes a block decoder 101 for decoding a block address given from the address buffer 6 and a logic gate circuit 102 that obtains the logic of the output of the block decoder 101 and the output decoder VD of the voltage detector circuit 9. Assuming that, for example, the boost power switches SWi are PMOS transistors as shown in FIG. 3, the logic circuit 102 may be made up of NAND gates Gi that are supplied with four outputs from the block decoder 101 and detection signal VD. The block decoder 101 of the switch control circuit 10 may be one function of a block decoder (not shown) that is normally provided as a pre-decoder of the row decoder 2 and the column decoder 4.

In connection to gates of the PMOS transistors as the boost power switches SWi, there are provided short-circuit NMOS transistors QNi that are controlled by an inverted signal of the detection signal VD.

During operation where the external power voltage Vext is normally supplied, the detection signal VD of the voltage detector circuit 9 remains in "L". In this status, only the NMOS transistors QNi are ON, and all of the boost power switches SWi remain ON. Once the detection signal VD becomes "H", controls are executed such that the output of the NAND gate Gi drops to "L" only in the selected block in which the output of the block decoder 101 is "H", and the boost power switch SWi remains ON only in the selected block while those of the other blocks turn OFF.

Figure 4:
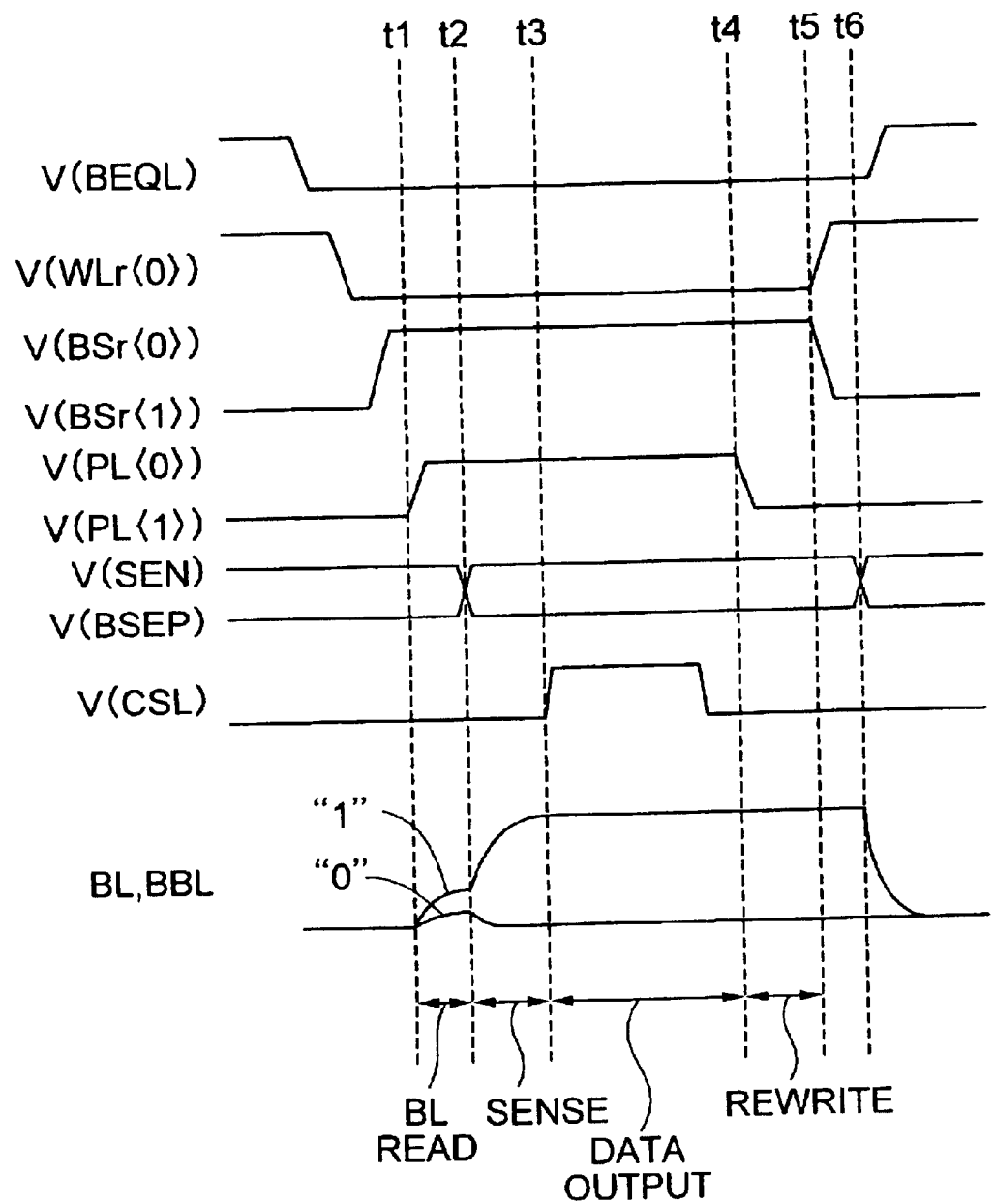
FIG. 4 is a diagram that shows operation waveforms in FeRAM according to the same embodiment of the invention.

Behaviors of FeRAM used in this embodiment are explained below in detail with reference to the waveform and timing chart of FIG. 4. In case of the series connected TC unit type ferroelectric RAM of FIG. 2, it is an example in which two memory cells Mi connecting to the complementary bit lines BL and BBL hold complementary data, e.g. "0" in one and "1" in the other, and two transistors and two capacitors cooperate to store binary values. In a standby mode, all of the word lines WL4<j> are supplied with boosted voltage VPP, and all of the ferroelectric capacitors Cj are kept short-circuited at both ends. By controlling the equalizer control signal V (BEQL) to "L" to thereby cancel equalizing operation of the paired bit lines BL and BBL and render the paired bit lines BL and BBL floating, the paired bit lines BL and BBL get prepared for reading data.

Then, by dropping one of the word lines selected by the row decoder 2 (WLr in case of FIG. 4) from VPP to the "L" level (=0), preparation is made to allow application of a voltage at opposite ends of the selected memory cell M0. Subsequently, in the selected block, when the block selection signal V(BSr<0>), V(BSr<1>) is changed from 0V to the "H" level, and the plate line potential V(PL<0>), V(PL<1>) is thereafter raised from the "L" level to the "H" level, a voltage is applied across the opposite ends of the selected memory cell in the selected block, and a signal voltage, which varies depending upon the value of data, "0" or "1", is read out at the paired bit lines BL and BBL time t1.

After that, at the sense amplifier SA time t2, the bit line data is sensed and amplified. The amplified bit line data is read out onto the data line of a column selected by the column selection signal CSL. Then, when the plate line potential V(PL<0>), V(PL<1>) is returned to "L" time t4, the read-out voltage from the sense amplifier SA is applied to the memory cell, and data is rewritten there. The "1" data destructed by the voltage of the plate line due to destructive reading is rewritten into the original spontaneous polarization status by the reverse voltage from the bit line side.

After that, the word line drive voltage and the block selection signal voltage drop time t5, the sense amplifier SA is inactivated time t6, and the next equalizing operation takes place.

During that operation in the embodiment, if the external power voltage Vext is normal, and boost power switches SWi are ON, the set-power circuit 7 is normally supplied with the external power voltage Vext, as explained above. If the external voltage Vext drops below a certain level during operation, the voltage detector circuit 9 detects it and outputs the detection signal VD="H". At that time, as already explained with reference to FIG. 3, the boost power switch SWi is maintained ON only in the selected block, and the remainder set-power switches SWi are turned OFF. Simultaneously, the interior power switch SW0 is turned OFF as well.

As a result, as long as the detection signal VD="L", the power line 8 exclusively connects only to the boost power circuit 7 of the selected block BLKi and the load to the power source is alleviated. Therefore, the power voltage supplied to the set-power circuit 7 in the selected block is enhanced, or at least, the voltage drop is prevented. Thus the read or rewrite operation can be completed normally, and destruction of data can be prevented. Also when the external power is interrupted, since the voltage of the capacitor Cb provided on the power line 8 is supplied only to the boost power circuit 7 of the selected block, power voltage interruption of several :s can be assured. The capacitor Cc provided on the power terminal line 12 of the boost power circuits 7 enables assurance of the power to the boost power circuits 7 in all blocks for a limited time after the power is off.

Figure 5:
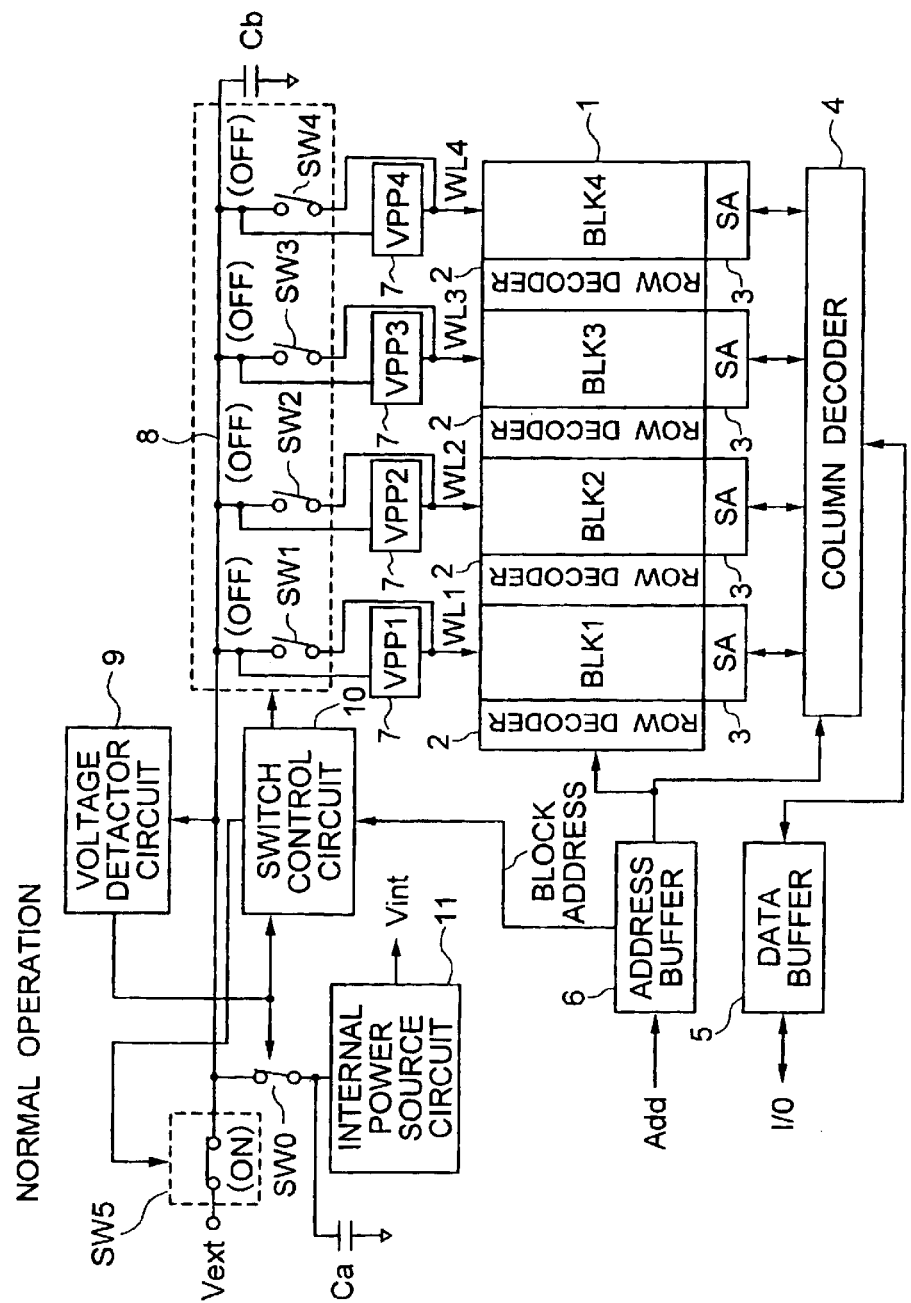
FIG. 5 is a diagram that shows configuration and normal operation of a memory cell array according to another embodiment of the invention.
Figure 6:
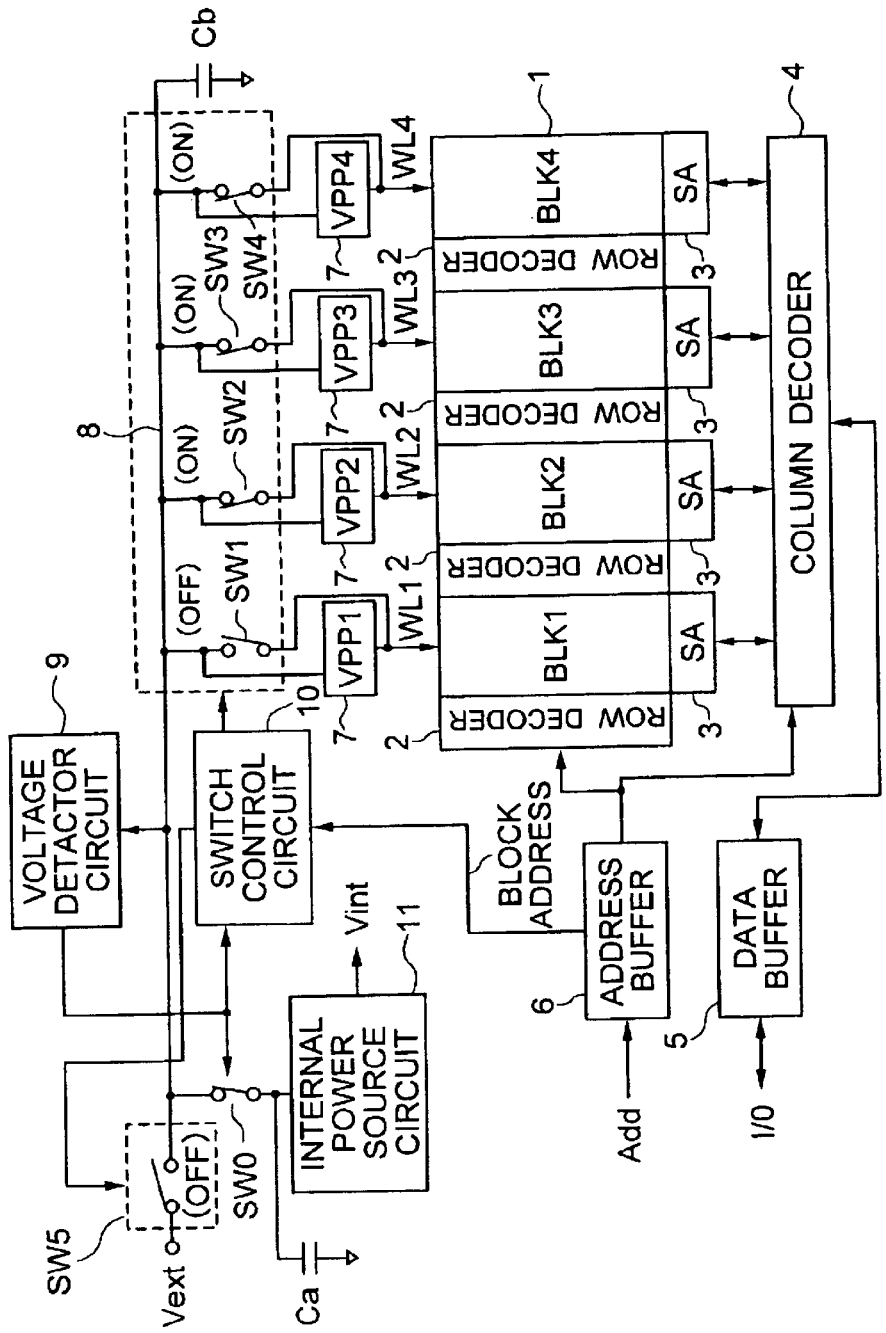
FIG. 6 is a diagram that shows configuration and operation at abnormal conditions of a memory cell array according to another embodiment of the invention.

FIGS. 5 and 6 are block diagrams which show configuration and operation of a second embodiment of the present invention in which the memory cell, for example, shown in FIG. 2 is employed and capacitance thereof is utilized as the power supply capacitor Cc. FIG. 5 shows the case of normal operation and FIG. 6 shows the case where the voltage of the power supply line is outside of the operation assurance range. Since FIGS. 5 and 6 are similar to FIG. 1, the same reference numerals are applied to the same elements and the detailed explanation for those will be omitted.

A switch SW5 is provided between the input terminal of the external power voltage Vext and the internal power switch SW0 and it is controlled by the switch control circuit 10. The switch SW5 is ON for normal operation and is OFF for abnormal power voltage.

The boost power circuits 7 are directly connected to the power line 8. The boost power switches SWi (i=1 through 4) are connected in parallel to the corresponding boost power circuits 7. Unlike the case in FIG. 1, each of the boost power switches SWi are OFF for normal operation.

Assuming that the block 1 is in operation and the voltage detector circuit 9 detects abnormal reduction in power voltage, the switch SW5 will be turned OFF and the states of the switch SW1 of the block in operation is maintained as it is while other switches of the other blocks are turned ON. Consequently, the boost power circuit 7 of the operating block 1 continues the boosting operation using the power capacitor Cb as a load. However, in other blocks, the boost power circuits will not be in operation because the power line 8 and the word lines are directly connected by switches SW2–SW4 using capacitors of transfer gates as power capacitors.

As a result, the power capacitor Cc which is necessary in the configuration in FIG. 1 is now unnecessary. Since capacitor requiring broad area is omitted, the area efficiency or integration will be improved.

Figure 7:
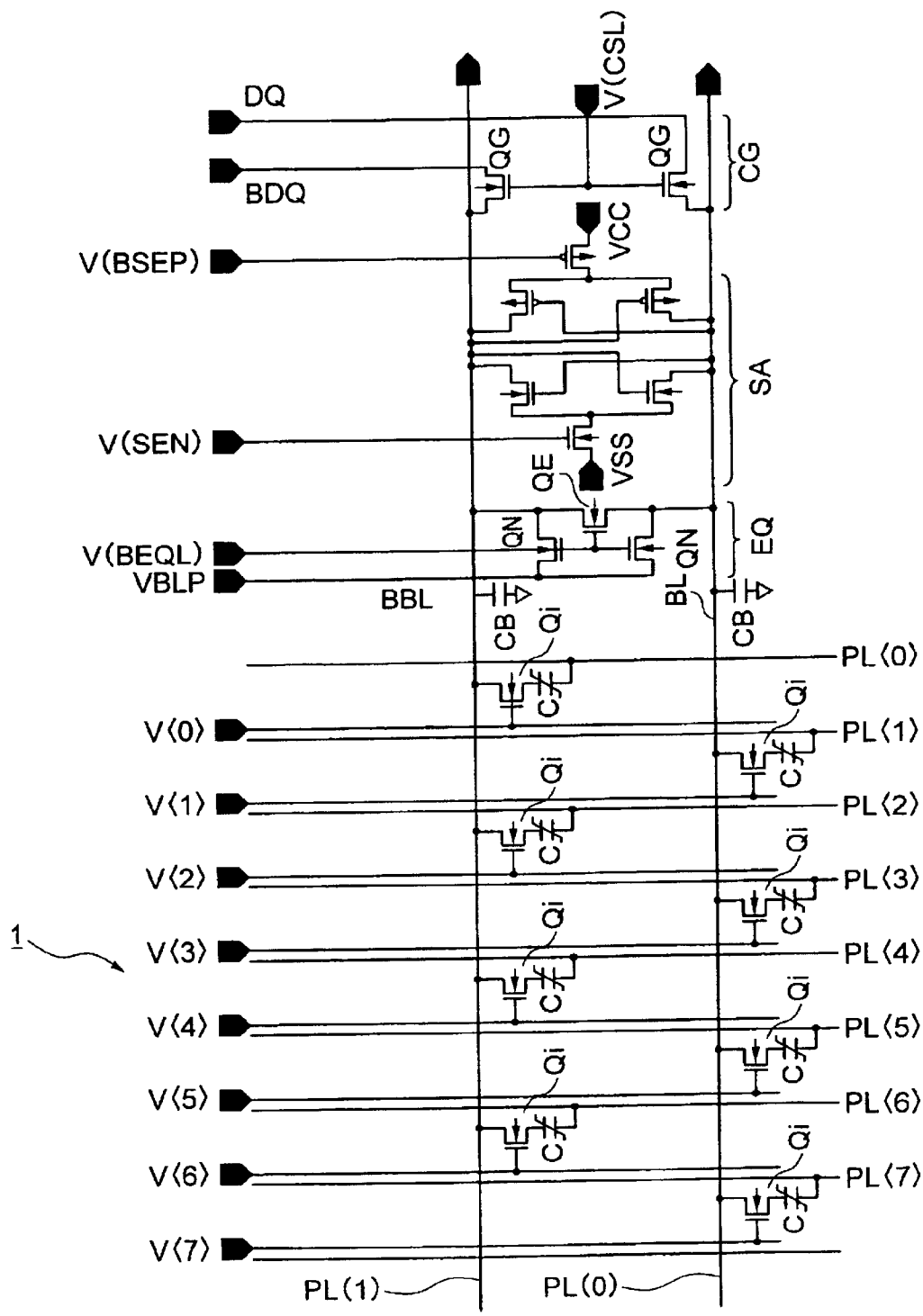
FIG. 7 is a diagram that shows configuration of another type of memory cell array which may be involved in the FeRAM according to the invention.

This invention is not limited to the embodiment shown above. The foregoing embodiment has been explained by way of series connected TC unit type ferroelectric RAM serially connecting a plurality of memory cells each made up of one transistor and one capacitor. However, the invention is similarly applicable to a normal memory structure in which each memory cell is made up of one transistor and one capacitor as shown in FIG. 7, or a memory structure in which each memory cell has two transistors and two capacitors.

As described above, FeRAM according to the invention enhances or ensures the power voltage of a selected block and thereby prevents destruction of stored data when an external power source drops below an operation assurance voltage level, by turning off power switches of boost power circuits in all blocks other than the power switch of the boost power circuit of the boost power circuits in the currently selected block.

What is claimed is:

1. A ferroelectric memory comprising:
   a memory cell array of memory cells having ferroelectric capacitors, which is divided into a plurality of blocks;
   a first power switch of normally closed type connected to an external power terminal;
   a power line, one end thereof being connected to said first power switch and the other end thereof being grounded via a first power capacitor;
   a boost power circuit connected to said power line and provided in each said block of said memory cell array to generate a boost voltage required for operation of the memory;
   a second power switch of normally open type connected in parallel to said boost power circuit and provided in each said block of said memory cell array;
   a voltage detector circuit for detecting a drop of voltage level of said power line; and
   a switch control circuit for turning on said second power switches in said blocks of said memory cell array excluding the second power switch in a currently selected block in response to said voltage detector circuit.

2. The ferroelectric memory according to claim 1, further comprising:
   an internal power circuit supplied with the voltage of said power line to output an internal power voltage;
   a second power capacitor between the voltage supply point and the ground; and
   an internal power switch provided between said internal power circuit and said power line to be turned off under control of an output of said voltage detector circuit.

3. The ferroelectric memory according to claim 1, wherein said switch control circuit includes:
   a block decoder for decoding an address signal and selecting a block from said memory cell array; and
   a logical gate for controlling said first and second power switches and said internal power switch in accordance with a logic level of an output of said block decoder and a detection output of said voltage detector circuit.

4. The ferroelectric memory according to claim 3, wherein said switch control circuit selects said block in response to a block address from an address buffer for receiving an input address.

5. The ferroelectric memory according to claim 1, wherein said memory cell array includes a plurality of transistors connected in series between bit lines and plate lines individually and driven by different word lines, and ferroelectric capacitors connected in parallel with said transistors.

6. The ferroelectric memory according to claim 1, wherein a unit cell of said memory cell array comprises two transistors and two ferroelectric capacitors.

7. The ferroelectric memory according to claim 1, wherein a unit cell of said memory cell array comprises a transistor and a ferroelectric capacitor.

* * * * *